United States Patent [19]

Vartti et al.

[11] Patent Number: 5,422,918

[45] Date of Patent: Jun. 6, 1995

[54] CLOCK PHASE DETECTING SYSTEM FOR DETECTING THE PHASE DIFFERENCE BETWEEN TWO CLOCK PHASES REGARDLESS OF WHICH OF THE TWO CLOCK PHASES LEADS THE OTHER

[75] Inventors: Kelvin S. Vartti, Vadnais Heights; Thomas T. Kubista, Eagan, both of Minn.

[73] Assignee: Unisys Corporation, Blue Bell, Pa.

[21] Appl. No.: 163,625

[22] Filed: Dec. 9, 1993

[51] Int. Cl.6 ............... H04L 7/00; H04L 25/36; H04L 25/40
[52] U.S. Cl. ............... 375/371; 375/359; 327/12
[58] Field of Search ............... 375/118, 119, 120; 331/1, 2; 455/180.3, 280, 260; 307/262, 510, 511; 328/133, 155

[56] References Cited

U.S. PATENT DOCUMENTS 4,594,564 6/1986 Yarborough, Jr. ............... 328/133 X
5,266,851 11/1993 Nukui ............... 328/133 X

FOREIGN PATENT DOCUMENTS 0563945 3/1991 European Pat. Off. .

OTHER PUBLICATIONS

Motorola Product Book, pp. 6-75 through 6-78 and 6-20 through 6-24.

Primary Examiner—Stephen Chin
Assistant Examiner—Bryan E. Webster
Attorney, Agent, or Firm—Glenn W. Bowen; Charles A. Johnson; Mark T. Starr

[57] ABSTRACT

A phase detecting system is provided for detecting when phase differences which occur between first and second clock pulses from a clock generator exceed acceptable tolerances, regardless of whether the first clock pulse leads the second clock pulse or the second clock pulse leads the first clock pulse. Two identical phase detectors are utilized each of which includes a phase detecting circuit, one group of signal delay elements that allow flip-flops in the phase detecting circuits time to set in order to detect the phase changes, and another group of signal delay elements coupled to the flip-flops which are set so the phase detecting circuit is capable of detecting the nominal phase delay times between the first and second clock pulses. The phase detecting circuits also each have a pair of setable latches and logic circuitry which is coupled to the latches to control them such that each latch is associated with one of the clock pulses, and the phase detecting circuits function to active clock phase identification signals that identify which of the two clock pulses leads the other.

14 Claims, 2 Drawing Sheets

CLOCK PHASE DETECTING SYSTEM FOR DETECTING THE PHASE DIFFERENCE BETWEEN TWO CLOCK PHASES REGARDLESS OF WHICH OF THE TWO CLOCK PHASES LEADS THE OTHER

BACKGROUND OF THE INVENTION

Field of the Invention

This invention relates to the synchronization of clocks and the detection of clock phase differences, and more particularly to a phase detector circuit and a combination of such circuits to detect phase differences between two clock phases.

In the design of phase detectors for the detection of phase differences between clock phases in high speed clocks, it is desirable to avoid the use of phase lock loops. Various types of phase detectors employing digital latches have been designed to accomplish this purpose. Motorola commercially sells two phase detectors designated as MC12040 and MC 4343/MC4044 which employ digital latches. The phase detector of the MC12040 product and the detector of the present invention both detect phase differences on the leading edge of the input clock signal. The phase detector of the present invention, however, has a number of improvements which give it decided advantages. An inherent feature of the phase lock loop is that it relies on the time average of the phase detector output signals and cannot, therefore, respond to a single out of phase occurrence of two signals. A second characteristic of phase detectors in a phase lock loop application is that they act to control the frequency of the second or non-reference signal.

SUMMARY OF THE INVENTION

A clock phase detecting system for detecting whenever phase differences occur between first and second clock pulses exceed acceptable tolerances regardless of whether the first clock pulse leads the second clock pulse or the second clock pulse leads said first clock pulse. The phase detector of this invention responds in real time to a specified phase difference. Phase detectors and delay lines are included in the system which eliminates detrimental race conditions. The design incorporates flip-flops that provide for both the necessary functional behavior while assuring appropriate circuit testability. An important feature of the design of the phase detection is that it eliminates all feedback paths from the gates driven by the flip-flops to the gates driven by the derived clock input signals. This provides the significant advantage that the phase detector is testable with comparatively unsophisticated non-sequential test algorithms. Further, the design provides for the addition of two functionally redundant paths to each of the output gates that are driven by the level 1 flip-flops with the advantage that spurious unwanted output spikes are eliminated and thereby do no occur on the output gates when the two flip-flops are reset.

First and second identical phase detectors are used in the invention each of which includes a phase detecting circuit that takes a predetermined amount of time to detect phase changes. First and second signal delay elements are employed which have a delay time that allows the phase detecting circuits time to detect the phase changes. Third and fourth signal delay elements are also employed which are set so that the third signal delay element has a delay time that is approximately equal to the nominal delay between the turn-on of the first clock pulse and the turn-on of the second clock pulse so that the fourth signal delay element has a delay time that is approximately equal to the nominal delay between the turn-on of the second clock pulse and the turn-on of the first clock pulse.

The recited elements are coupled and constructed such that the first phase detector produces a first active level clock phase identification signal on one output when the first clock pulse leads the second clock pulse, and which goes back to an inactive level when the second clock pulse turns off, and such that the second phase detector means produces a second active level clock phase identification signal on an output when the second clock pulse leads the first clock pulse, and which goes back to an inactive level when the first clock pulse turns off. A first output latch may be coupled to an output of the first phase detector to latch the first active level phase identification signal and a second output latch may be coupled to an output of the second phase detector to latch to the second active level phase identification signal.

The phase detector circuits include a first setable latch that is associated with the first clock pulse which has an output that produces an active set signal when said first setable latch is set and a second setable latch that is associated with the second clock pulse which has an output that produces an active set signal when the second setable latch is set. Logic circuitry is coupled to the first and second setable latch which is constructed such that the setable latch that is associated with the earlier of the first and second clock pulses that turns on produces an associated active clock phase identification signal. The first and second setable latches are reset when the first and second clock pulses turn off after the first and second setable latches have been set. Both of the logic circuits include first and second multiplexers that are coupled so that the first multiplexer allows the first setable latch to set upon the turn-on of said first clock pulse, and the second multiplexer allows the second setable latch to set upon the turn-on of the second clock pulse.

BRIEF DESCRIPTION OF THE DRAWINGS

The invention is described by reference to the drawings in which.

DETAILED DESCRIPTION OF THE INVENTION

The phase detector of the present invention may be implemented in a gate array that is made up of standard gate array macros. Therefore, it eliminates the use of cross-coupled gates which can create testability and timing problems. The phase detector also does not contain any unlatched feedback loops which also can create testability problems. Further, there is no direct path from the input clock lines through logic circuits in the phase detector which bypass the latches. This feature eliminates the possibility of glitches occurring on the output lines due to race conditions. The phase detector also is initialized to a known state when the system is started.

The phase detectors are combinable into an arrangement in which the input clock signals are supplied through controlled delay circuits, and two phase detecting circuits are employed with two separate output latches. One phase detector detects when a first one of the clock phases is leading the second clock phase by a predetermined time interval, and the other phase detector will detect when the second clock phase is leading the first clock phase by a predetermined time interval.

Figure 1:
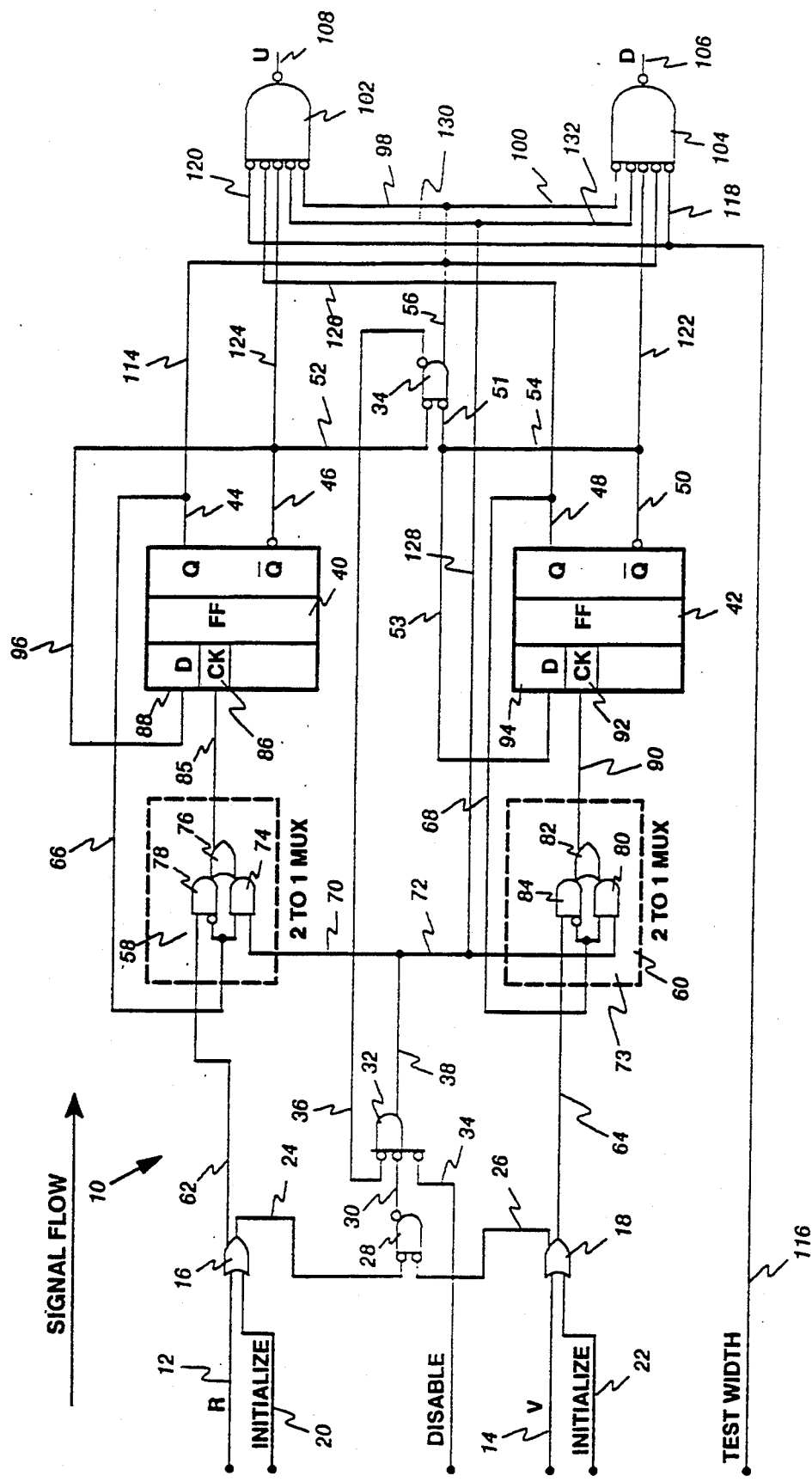
FIG. 1 is a schematic of a phase detector circuit constructed in accordance with this invention.

FIG. 1 shows an embodiment of the phase detector 10. It is designed to indicate whether the R clock on line 12 is leading or lagging the V clock on line 14. These inputs are connected respectively to the OR gates 16 and 18. The other input to each of these two OR gates is an initialize signal, lines 20 and 22, that is used for test purposes. During normal operation of this circuit, the initialize lines 20 and 22 are held as an inactive low level. The initial state of the flip-flops 40 and 42 is assured by a power-up clear signal which is not shown.

The OR gates 16 and 18 have two outputs, one of which is supplied on lines 24 and 26 to the inputs of AND gate 28. In these drawings an open circle denotes a low-true condition on that terminal. Gate 28 will, for example, provide a low-true signal on line 30 if input lines 24 and 26 are both low-true. Otherwise, line 30 will be a high-not-true signal.

The phase detector circuit is designed so that it can detect whether the R clock leads the V clock or if the V clock leads the R clock. The operation of this circuit is identical in both circumstances, except that the R and V related components function in one manner when R leads V, and they function in an inverse manner when V leads R. In the following description it will be assumed that the R clock leads the V clock, but the operation of the circuit when V leads R will be readily apparent of the described condition because of this relationship.

In the normal use of this circuit, the flip-flops 40 and 42 are initialized to the cleared condition. In that situation the Q outputs hold lines 44 and 48 at a low logic level. Lines 46 and 50 which are associated with the Q outputs are held at high logic levels. This cleared condition is assumed as a starting point in explaining the operation of this circuit.

Consider the two output gates 102 and 104. Each is a five input AND circuit with respect to low logic levels. The U-output, line 108, for example, will be a low level if the five input lines 120, 126, 124, 130 and 98 are all low. Initially the U and D outputs, lines 108 and 106, are high levels.

The discussion can be simplified by recognizing that the TEST WIDTH signal on line 116 to the output gates 102, 104 is held low for normal operation of this circuit. Therefore, input lines 120 and 118 are temporarily ineffective since they are static low level signals that are not activated in the phase detection process.

Consider the remaining four lines at each output AND gate 102 and 104. These are lines 126, 124, 130 and 98 for gate 102 and 114, 122, 132 and 100 for gate 104. Initially one of these lines for each AND gate 124 and 122 is a high level while the rest are held low. This is the result of the flip-flops being initialized to the cleared condition. Lines 126, 114, are at low levels after clearing the flip-flops. The initial disposition of the flip-flops also establishes the logic levels through line 56. The cleared condition of flip-flops 40 and 42 cause lines 51 and lines 52, 54, respectively, to be held high so that line 56 is a low logic level. Finally, the cleared condition on flip-flops 40 and 42 assures a low level on the remaining two lines 130 and 132. Notice that with line 56 low, line 36 is assured to be a high level. Since line 36 is an input to gate 32, output line 38 will be a low level acting to hold lines 130 and 132 low.

A key consideration in this design is the way in which the two flip-flops 40 and 42 are connected to the input AND gates 102 and 104, while the not-Q output on flip-flop 40 is connected to AND 102. The Q output on flip-flop 40 is cross-connected to AND 104. The Q output on flip-flop 42 is cross-connected to AND 102, while the not-Q output on flip-flop 42 is connected to AND 104. This connection scheme assures that outputs U can be low only when flip-flop 40 is set and flip-flop 42 is cleared. When both flops are set or cleared, outputs D and U must necessarily be high.

The flip-flops are designed to be clocked on the positive going edge of the signal applied to their clock inputs. Assuming that the signal applied to the data input is stable prior the clock transition from a low to a high level, the logic level at the data input will be transferred to the Q output and latched during this transitional period. Once the data is latched, it is insensitive to level changes on its data input and the return of the clock signal to a low level.

The two-to-one multiplexer circuits 58 and 60 provide the clock signals for the two flip-flops 40 and 42. With these flops in their initial cleared condition, lines 66 and 68 will be low. These are the address lines for the multiplexer. A low level on this line selects the path through the gates 78, 84 with the open circle representation which signifies an inverted input, specifically gates 78 and 84. This same low level assures the blockage of the paths through gates 74 and 80 on lines 70 and 73, respectively.

It is now appropriate to consider the impact of an active clock signal. Here we suppose that R clock goes high well ahead of the V clock. The high going edge of this signal propagates through the gate 16, the line 62, the gates 76 and then on line 85 to the clock terminal 86 to clock flip-flop 40. Since line 96 to the D input 88 terminal is a high level, the result will be to set flip-flop 40. When the set condition is achieved, line 124 will be driven low to make the low level AND condition on gate 102 since all of the inputs to this gate will now be low. The result is that output U, line 108, will be switched to a low level with input lines 120, 126, 124, 130 and 98 low. Line 130 is connected to the output of gate 32 through the lines 72 and 128. Output D on line 106 of AND gate 104, on the other hand, will remain high with input lines 114 and 122 high and input lines 118, 132 and 100 low. The output of the AND gates 102 and 104 are inverted so that a low level signal output is produced when these gates are satisfied.

The R clock transition affects some other gates, but the result is to leave input lines 120, 118, 130, 132, 98 and 100 low on the output AND gates 102 and 104. Line 52 on gate 34 goes low, but output lines 56 and 36 remain unchanged because input line 51 controls the output of gate 34 by remaining high. Line 24 at the input to gate 28 changes the output on line 30, but line 36 was already holding the output of gate 28 on line 72 low.

The next step is to examine the effect of a V clock transition from a low to a high level. This assumes that the R clock remains active or high. The low to high going edge of the V clock propagates through gates 18, 80 and 82 on lines 22, 64 and 90. Line 90 is connected to the lock terminal 92 of the flip-flop 42. The result is to set flip-flop 42 and to return output U, line 108, to a high level. This is accomplished by bringing line 126 from a low to a high level.

It is time to look more closely at the purpose of gate 34. It accomplishes two tasks when both flip-flops are set. First, it enables gate 32 by bringing line 36 low. This enable will allow gate 32 to eventually provide a signal on line 72 to reset the two flip-flops 40 and 42. Its second task is to hold line 56 high when the flip-flops are reset. This is an important feature of this design since output U, line 108, and output D, line 106, cannot be allowed to spike or glitch high during the time that the flip-flops are being reset. Short duration spikes which would not be a problem in a phase lock loop application are intolerable in a real time application where one could erroneously indicate the relative phase of the R and V clock signals. Gate 34 has a third purpose when at least one of the flip-flops is cleared. In that situation it disables gate 32 to guard against unwanted clocking of either flip-flop 40 or 42 by spike pulses.

The holding feature of the previous paragraph depends on the propagation delay through gate 34. When flip-flops 40 and 42 are cleared, the output lines 44, 46, 48 and 50 will quickly reassert control over the output gates 102 and 104. When this transition takes place, however, there is a period of uncertainty where it is possible that an output gate thinks only one flip-flop is set. The propagation delay time through gate 34 will act to sustain the high level on output 56 past the switching point and thereby reduce the probability of an unintended output glitch or spike.

The purpose of gate 28 is to provide the clock signal which resets both flip-flops 40 and 42 when both clock inputs have returned low or inactive. Suppose that with both the R and V clocks active or high, the R clock returns low. Both flip-flops 40 and 42 will remain set. Output line 30 on gate 28 will remain high when line 24 goes low since line 26 remains high. However, when the V clock subsequently goes low, line 30 will switch low. This transition will complete the low level AND condition on gate 32 with the result that output 38 on gate 32 will switch high. Since both flip-flops are in the set condition, the multiplexer address lines 66 and 68 will be high to select paths through gates 74 and 80. The high going edge on output 38 will, therefore, be propagated through gates 74 and 76 to flip-flop 40 and through gates 80 and 82 to flip-flop 42. This signal will reset the flip-flops since line 96 and line 53 to the D input terminal 94 are now low.

Another feature of gate 32 needs to be noted. The output 38 is connected to the output gates through line 128 and lines 130 and 132. This was done to further eliminate the possibility of unwanted spikes or glitches when the flip-flops are reset. Lines 128 and 130 will be held high past the point where the flip-flops are cleared because of the propagation delay through gates 34 and 32.

The propagation delays through gates 32 and 34 serve a second important purpose in this design. They assure the integrity of the clock signal used to reset flip-flops 40 and 42. Since the one signal on output 38 of gate 32 is used to clock both flip-flops, the concern is that if one flip-flop operated enough faster than the other flip-flop, the integrity of the clock signal could be destroyed and only the fast path flop would be successfully cleared. For very high speed clock operation, time differences between clock phases may be very small and yet not satisfy the circuit conditions. In such cases, the phase detector circuits may not have time to operate to detect these differences. The circuits from which the clock phases that are applied to the phase detectors are derived may also be subject to time delays caused by circuit board and component elements. Additionally, it is desirable to be able to measure both whether the R phase leads the V phase or the V phase leads the R phase within predefined tolerances by use of the same phase detector circuit. This desired monitoring can be achieved by the phase monitoring system of FIG. 2.

Figure 2:
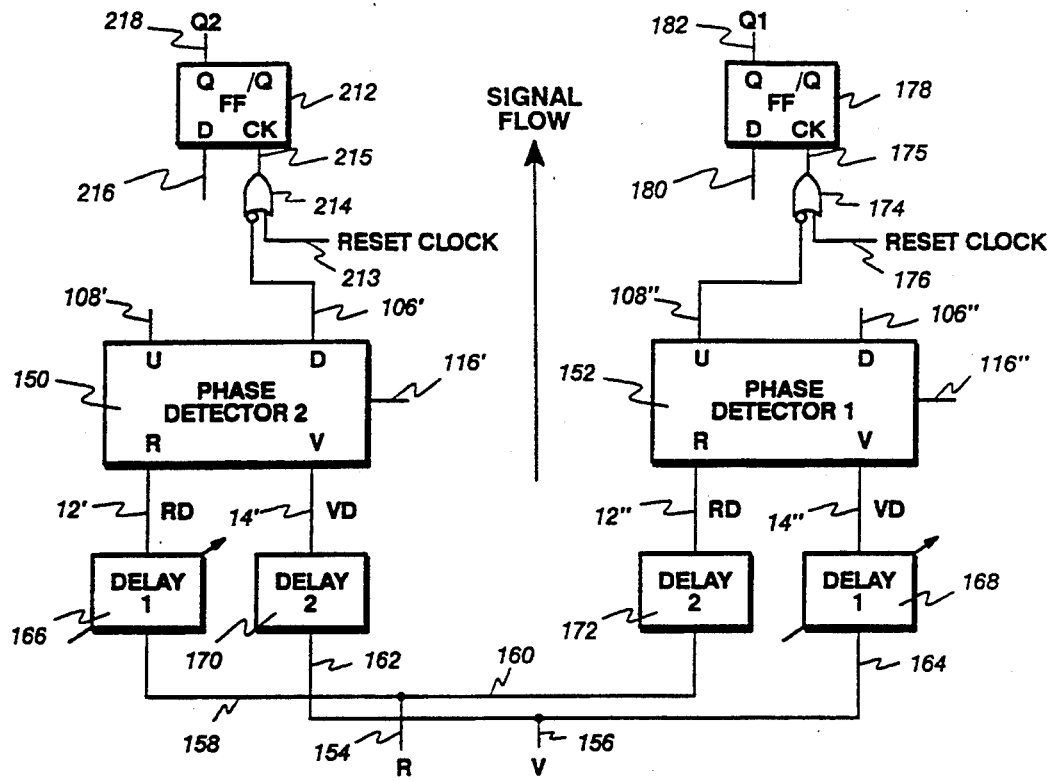
FIG. 2 is a block diagram illustration of the unitization of two phase detectors in an arrangement which detects when either of the input clock signals leads the other one by a predetermined time.

In the system of FIG. 2 two identical phase detector circuits 150 and 152 of the type described in FIG. 1 are employed. For example, R and V clocks may be said to be in phase if the two leading edges were within 500 ps of each other. If R leads V by more than 500 ps, the presumption is that an R leads V indication must be forthcoming. If, on the other hand, V leads R by more than 500 ps, the presumption is that a V leads R indication is needed. In this system the R clock is supplied on line 154, and the V clock is supplied on line 156. The R clock is supplied to phase detector 150 on line 158 and to phase detector 152 on line 164. Phase detector 150 indicates when the V clock leads the R clock by more than a delay threshold tolerance. Phase detector 152, on the other hand, indicates when the R clock leads the V clock by more than a second specified delay tolerance.

The phase detector flip-flops are set independently of the phase difference of the R and V clocks. A minimum pulse width is required to enable the flip-flops 178 and 212 to be driven by the phase detector to be set even when high speed clock operations do not allow the time difference between the R and V clock phases to be sufficient to provide such minimum pulse width. The delays 166 and 168 which are labelled DELAY 1 are employed in order to respectively provide such a minimum pulse width to the D terminal of the phase detector 150 and to the U terminal of the phase detector 152. These delay circuits are desirably made variable so that they can be adjusted to accommodate the phase detector for different gate array speeds. The variable delay 166 is connected to the line 158 to supply a delayed R clock phase which is labelled RD on the line 12' to the R input of the phase detector 150. The variable delay 168 is connected to the line 164 to supply a delayed V clock phase, which is labelled VD, on the line 14" to the V input of the phase detector 152.

In order to set precise allowable delay limits between the clock phases, the delays 170, 172 which are labelled DELAY 2 are employed. Generally, the delays 170 and 172 will be equal so that the same time tolerance will be used when the R clock phase leads the V clock phase and when the V clock phase leads the R clock phase. The time delays 170 and 172, however, could be different in accordance with the requirements of the system. The delay 170 is coupled to the line 162 to provide the delayed clock signal, which is labelled VD, on the line 14' to the V input terminal of the phase detector 150. The delay 172 is coupled to the line 160 to provide the delayed R clock signal, which is labelled RD, on the line 12" to the R input of the phase detector 152. The relationships of the various signals that occur during the operation of the system of FIG. 2 is described by reference to the timing diagram of FIG. 3 in which it is assumed that the R clock phase leads the V clock phase. In this instance, the U output clock line 108" is utilized to detect this condition. The U output line 108' of the phase detector 150 and the D output line 106" do not have to be utilized in the illustrated embodiment. The line 108" is connected to an OR gate 174. The input signal of the OR gate 174 undergoes logical inversion so that a high to low level transition on the line 108" will pass through the gate 174 to the line 175 as a low-to-high level signal transition that clocks the flip-flop 178. The second input line 176 receives a reset clock 12 signal which, when it goes from a low to a high level, applies the reset pulse that is required after a phase delay between the R and V clock phases has been detected.

The flip-flop 178 is utilized to latch the U output signal on the line 108" that indicates that the R clock phase leads the V clock phase when it undergoes a high to low level transition. Flip-flop 178 is a D, or delay-type, in which the D input terminal is held at a high state by the line 180 until resetting is required at which time the signal on the line 180 drops from a high to a low level. The output of the flip-flop 178 on the line 175 is latched by the flip-flop 178, and the output of the flip-flop 178 is supplied on the Q1 output line 182.

Figure 3:
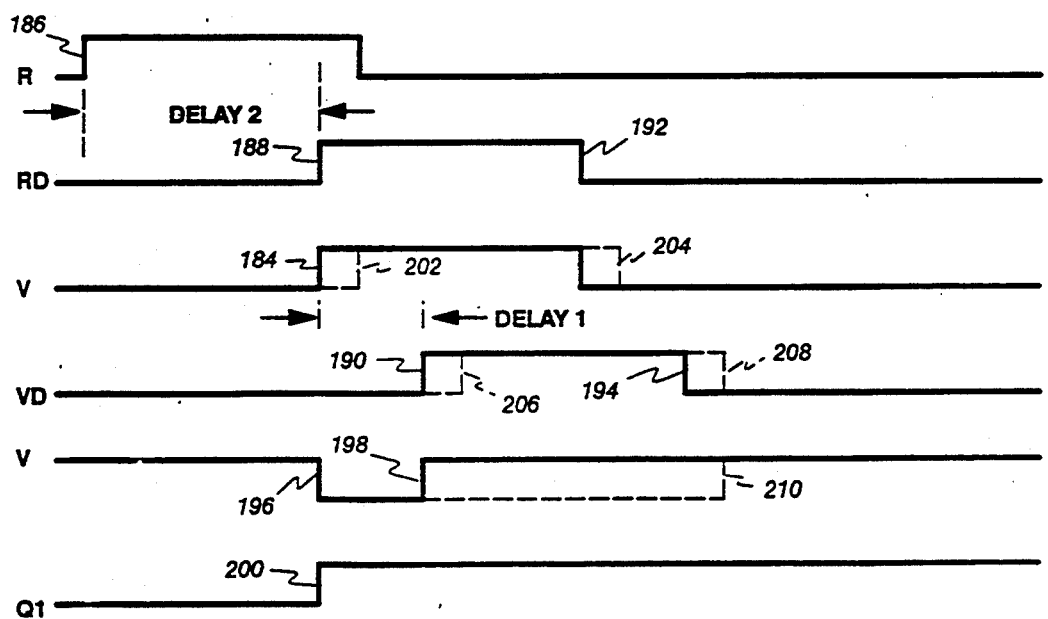
FIG. 3 is a timing diagram associated with the arrangement of FIG. 2.

Timing of the V and R clock phases is shown in FIG. 3 for the condition where the leading edge 184 of the V clock occurs later than the leading edge 186 of the R clock by a nominal expected delay. The DELAY 2 time of the delay element 172 is set to this expected delay so that the leading edge 188 of the delayed RD clock signal occurs at the same time as the edge 184 of the V clock phase. As previously mentioned, in order to allow the flip-flops driven by the phase detector time to set, an additional delay 168 must be supplied so that the leading edge 190 of the delayed VD clock signal is delayed from the leading edge 184 of the V clock phase by the delay 1 time. The U clock pulse on the line 108" is controlled by the rising edges 188 of the RD signal and the rising edge 190 of the VD signal. The U clock output to the OR gate 174 will provide high to low transition edge 196 on the occurrence of the rising edge 188 of the RD signal and a low to high transition edge 198 upon the occurrence of rising edge 190 of the VD clock signal. In FIG. 3 the transition edge 198 is shown as a solid line which occurs when the leading edge 184 of the V clock phase trails the leading edge 186 of the R clock phase by the nominal expected duration and is equal to the DELAY 1 time.

Upon transition of the U signal from a high to a low level on the edge 196, the Q1 signal will make a transition on the edge 200 from a low to a high level. This indicates that the R clock phase leads the V clock phase. In the example shown, if the leading edge 202 of the V clock phase (as shown by dotted lines) were to occur later than the optimum transition edge 184, the trailing edge 204 of the V clock phase would also be delayed (assuming a constant pulse width is maintained). The RD trailing edge 192, however, remains fixed. Thus, the leading and trailing edges 206, 208 of the VD pulse will be correspondingly delayed. The U pulse will still undergo the high to low transition 196 upon the occurrence of the trailing edge 192 of the RD pulse, and the Q1 signal will still set on the transition edge 206. However, since the trailing edge of the VD pulse 208 has been delayed, the U pulse will not undergo its transition from a low to a high state until the transition edge 210. Thus, it is seen that when the R clock phase leads the V clock phase by more than the desired amount, the pulse width of the U output signal will be increased.

Correspondingly, if the R clock phase leads the V clock phase by less than the normal amount, the leading and trailing edges of the V clock phase would occur sooner, and, therefore, the trailing edge of the VD clock pulse would occur sooner, and the U output signal would have a shorter pulse width. Test width signals are applied to the lines 116' and 116" (which correspond to line 116 of FIG. 1) to test the pulse width condition of each of the phase detectors 150 and 152.

The phase detector 150, the OR gate 214, the D input line 216, the reset line 213, the output line from the OR gate 214 to the clock input of the flip-flop 212, the latching flip-flop 212 and its output line 218 are utilized in a similar manner to detect the occurrence of a pulse on the D output line 106' that would occur if the V clock phase led the R clock phase. Thus, the system of FIG. 2 allows for detection of either the condition where the R clock phase leads the V clock phase or the V clock phase leads the R clock phase.

The forgoing is considered as illustrative only of the principles of the invention. That is, the many features and advantages of the invention are apparent from the detailed specification, and thus it is intended by the appended claims to cover all such features and advantages of the invention which fall within the true spirit and scope thereof. Further, since numerous modifications and changes will readily occur to those skilled in the art, it is not desired to limit the invention to the exact construction and application shown and described, and, accordingly, all suitable modifications and equivalents may be resorted to, falling within the scope of the invention.

We claim:

1. A circuit for detecting clock phase differences between first and second clock pulses that are derived from a clock comprising, a first setable latch that is associated with said first clock pulse and that has an output that produces an active set signal when said first latch is set, and a second setable latch that is associated with said second clock pulse and that has an output that produces an active set signal when said second latch is set, first and second output means each having an input respectively coupled to said first and said second outputs of said first and said second latches, said first and said second output means being constructed to receive said first and said second clock phases respectively on first and second input lines, and to set said first latch when said first clock pulse turns on and to set said second latch means when said second clock pulse turns on, logic circuit means coupled to said first and said second latches wherein said logic circuit means is constructed to control said first and said second output means such that the output means coupled to the latch that is associated with the earlier of said first and said second pulses that turns on produces an associated active level clock phase identification signal, and the output means coupled to the other latch that is associated with the later of said first and said second pulses that turns on does not produce an associated active level clock phase identification signal, said logic circuit means being further constructed to reset said first and second latches when said first and second clock pulses turn off, and to control said output means which is associated with the earlier of said first and said second clock pulses that turn on to enable said associated active level clock phase identification signal to return to its inactive state after both said first and said second clock pulses have turned off, the improvement wherein, said logic circuit means comprises first and second multiplexers wherein said first multiplexer has first and second inputs and an output which is coupled to said first latch that allows said first latch to set when a first active level multiplexer output signal occurs, said first input of said first multiplexer is coupled to receive said first clock pulse and said second input of said first multiplexer is coupled to receive a logic signal that is at an active level when both said first and said second clock pulses turn on, said first active level multiplexer output signal allows said first latch to set upon the turn-on of said first clock pulse, said logic signal allows said first latch to reset upon the generation of said active logic signal, said second multiplexer has first and second inputs and an output coupled to said second latch that allows said second latch to set when a second active level multiplexer output signal occurs, said first input of said second multiplexer is coupled to receive said second clock pulse and said second input of said second multiplexer is coupled to receive said logic signal, said second active multiplexer output signal allows said second latch to set upon the turn-on of said second clock pulse, and said logic signal allows said several latches to reset upon the generation of said active level logic signal.

2. A circuit for detecting clock phase differences as claimed in claim 1 comprising means for coupling a width testing signal to an input of each of said first and second output means.

3. A circuit for detecting clock phase differences as claimed in claim 1 wherein said first and second latches each comprise D-type flip-flops that each have a data input terminal and a clock input terminal, the outputs of said first and second multiplexer means have inputs that are respectively coupled to the clock input terminals of said first and second latches, said first and second multiplexer means both have a set terminal and a reset input terminal, and said D-type first and second latches have their data inputs coupled to the reset output terminals of their respective flip-flops.

4. A circuit for detecting clock phase differences as claimed in claim 3 comprising means for coupling a width testing signal to an input of each of said first and second output means.

5. A phase detecting system for detecting when phase differences which occur between first and second clock pulses that are derived from a clock exceed acceptable tolerances regardless of whether said first clock pulse leads said second clock pulse or whether said second clock pulse leads said first clock pulse comprising, first and second identical phase detectors each of which comprise a phase detecting circuit that takes a predetermined amount of time to detect said phase changes, a first input, a second input and at least one output, first and second signal delay means of a first group of delay means each of which has a delay time that is set to allow said phase detecting circuits time to detect said phase changes, third and fourth signal delay means of second group each of which is set so that said third signal delay means has a delay time that is approximately equal to the nominal delay between the turn-of said first clock pulse and the turn on of said second clock pulse and so that said fourth signal delay means has a delay time that is approximately equal to the nominal delay between the turn on of said second clock pulse and the turn on of said first clock pulse, first and second clock feed lines coupled to said clock means such that said first clock feed line receives said first clock pulses and said second clock feed line receives said second clock pulses, wherein said above recited elements are coupled so that said first signal delay means of said first group is coupled between said second clock feed line and the second input of said first phase detector, said first signal delay means of said second group is coupled between said first clock feed line and first input of said first phase detector, said second signal delay means of said second group is coupled between said first clock feed line and the second input of said second phase detector, and said second signal delay means of said first group is coupled between said second clock feed line and said first input of said second phase detector, said first and second phase detector being constructed such that said first phase detector produces an active level first clock phase identification signal on one of said outputs of said first phase defector when said first clock pulses turns off. if said first clock pulse leads said second clock pulse, and which goes back to an inactive level when said second clock pulse turns off, and such that said second phase detector produces an active level second clock phase identification signal on said second output of said second phase detector when said second clock pulse turns off if said second clock pulse leads said first clock pulse, and which goes back to an inactive level when said first clock pulse turns off.

6. A phase detecting system as claimed in claim 5 comprising a first output latch means coupled to one of the outputs of said first phase detector for the latching of said first active level phase identification signal, and a second output latch coupled to one of the output terminals of the second phase detector for latching the active level of said second clock phase identification signal.

7. A phase detecting system as claimed in claim 5 wherein said first and second phase detectors are constructed such that said first clock phase identification signal has an active level duration that is:

(a) approximately equal to said delay time that is provided by said first delay means of said first group when said first clock pulse leads said second clock pulse by said nominal delay time, (b) greater than said nominal delay time when said first clock leads said second clock pulse by an amount greater than said nominal delay time, and is less than said nominal delay time when said first clock pulse leads said second clock pulse by an amount less than said nominal delay time, and said second phase identification signal has an active level duration that is approximately equal to said delay time that is provided by said second delay means of said first group when said second clock pulse leads said first clock pulse by said nominal delay time, (c) is greater than said nominal delay time when said second clock pulse leads said first clock pulse by an amount greater than said nominal delay time, and (d) is less than said nominal delay time when said second clock pulse leads said first clock pulse by an amount less than said nominal delay time.

8. A phase detecting system as claimed in claim 7 wherein each of said first and second phase detectors comprise a first and a second output, and said phase detecting system comprises a first output latch coupled to said first output latch coupled to said first output of said first phase detector for the latching of the active level of said first clock phase identification signal and a second output latch coupled to said second output of said second phase detector for the latching of the active level of said second phase identification signal.

9. In a phase detecting system as claimed in any of the claims 5, 6, 7 and 8 the improvement wherein said first and second phase detectors each comprise, a circuit for detecting clock phase differences between said first and second clock pulses which comprises, a first setable latch that is associated with said first clock pulse and that has an output that produces an active set signal when said first latch is set, and a second setable latch that is associated with said second clock pulse and that has an output that produces an active set signal when said second latch is set, first and second output means each having an input respectively coupled to said first and said second outputs of said first and said second latches, said first and said second output means being constructed to receive said first and said second clock phases respectively on first and second input lines, and to set said first setable latch when said first clock pulse turns on and to set said second setable latch means when said second clock pulse turns on, logic circuit means coupled to said first and said second setable latches wherein said logic circuit means being constructed to control said first and said second setable latches wherein said logic circuit means being constructed to control said first and said second output means such that the output means coupled to the latch means that is associated with the earlier of said first and said second clock pulses that turns on produces an associated active level clock phase identification signal, and the output means coupled to the other latch that is associated with the latter of said first and said second pulses that turns on does not produce an associated active level clock phase identification signal, said logic circuit means being further constructed to reset said first and second latches when said first and second clock pulses turn off, and to control said output means which is associated with the earlier of said first and said second clock pulses that turns on to enable said associated active level clock phase identification signal to return to its inactive state after both said first and said second clock pulses have turned off, the improvement wherein, said logic circuit means comprises first and second multiplexer means wherein said first multiplexer means has first and second inputs and an output which is coupled to said first latch that allows said first latch to set when a first active multiplexer output signal occurs, said first input of said first multiplexer is coupled to receive said first clock pulse and said second input of said first multiplexer is coupled to receive a logic signal that is at an active level when both said first and said second clock pulses turn off, said first active multiplexer output signal allows said first latch to set upon the turn-on of said first clock pulse, said logic signal allows said first latch to reset upon the generation of said active logic signal, said second multiplexer has first and second inputs and an output coupled to said second setable latch means that allows said second latch to set when a second active level multiplexer output signal occurs, said first input is coupled to receive said second clock pulse and said second input is coupled to receive said logic signal, said second active level multiplexer output signal allows said second latch to set upon the turn-off of said second clock pulse, said logic signal allows said second latch to reset upon the generation of said active level logic signal.

10. In a phase detecting system as claimed in claim 9 the further improvement comprising means for coupling a width testing signal to an input of each of said first and second output means.

11. A circuit for detecting the phase differences between two clock pulses, each from separate clock pulse trains of substantially identical clock pulses in which a clock pulse form each of said clock pulse trains occurs during a timing period comprising, setable means which comprises, (a) two flip-flops each of which has an input coupled to receive one of said clock pulse trains during said timing period and an output wherein the signal level transition of the clock pulse which first occurs on one of said inputs during a timing period results in a first output indication from the output of the flip-flop associated with the first occurring input signal and the second signal level transition of the other clock pulse during the timing period resulting in a second output indication from the output of the flip-flop associated with the second occurring input signal, (b) logic means coupled to both of the flip-flops constructed to receive said second output indication and to utilize said second output indication to deactivate said first output indication of the flip-flop that produced said first output indication during said timing period, (c) two multiplexer means coupled to said logic means and to said flip-flops constructed to cooperate with said logic gate means to deactivate simultaneous output indications on the outputs of both of said flip-flops when at least one of said clock pulses are terminated during said timing period, and (d) time duration responsive means for producing a time delay indication which is directly proportional to the time delay difference between said first occurring input and said second occurring input.

12. A circuit for detecting phase differences as claimed in claim 11 wherein said logic means comprises,
   (a) two output gates, one of which provides an output indication when one of said flip-flops receives the first occurring input signal on its input during a timing period and the other of which produces an output indication when the other of said flip-flops receives the first occurring input signal on its input,
   (b) first logic gate means having inputs coupled to be responsive to both said first and said second occurring input signals and a feedback input and to supply an input signal to both of said multiplexer means and to both of said output gates, and
   (c) second logic gate means having inputs coupled to be responsive to the output indications of both of said flip-flops and to supply an input signal to said feedback input of said first logic gate means and to both of said output gates.

13. In a phase detecting system as claimed in any of the claims 5, 6, 7 and 8 the improvement wherein said first and second phase detectors each comprise,
   (a) two output gates, one of which provides an output indication when one of said flip-flops receives the first occurring input signal on its input during a timing period and the other of which produces an output indication when the other of said flip-flops receives the first occurring input signal on its input,
   (b) first logic gate means having inputs coupled to be responsive to both said first and said second occurring input signals and a feedback input and to supply an input signal to both of said multiplexer means and to both of said output gates, and
   (c) second logic gate means having inputs coupled to be responsive to the output indications of both of said flip-flops and to supply an input signal to said feedback input of said first logic gate means and to both of said output gates.

14. In a phase detecting circuit as claimed in claim 13 the improvement wherein said logic means comprises,
   (a) two output gates, one of which provides an output indication when one of said flip-flops receives the first occurring input signal on its input during a timing period and the other of which produces an output indication when the other of said flip-flops receives the first occurring input signal on its input,
   (b) first logic gate means having inputs coupled to be responsive to both said first and said second occurring input signals and a feedback input and to supply an input signal to both of said multiplexer means and to both of said output gates, and
   (c) second logic gate means having inputs coupled to be responsive to the output indications of both of said flip-flops and to supply an input signal to said feedback input of said first logic gate means and to both of said output gates.

* * * * *